United States Patent [19]

Simko

[11] 4,053,349

[45] Oct. 11, 1977

[54] METHOD FOR FORMING A NARROW GAP

[75] Inventor: Richard T. Simko, Mountain View, Calif.

[73] Assignee: Intel Corporation, Santa Clara, Calif.

[21] Appl. No.: 654,111

[22] Filed: Feb. 2, 1976

[51] Int. Cl.² ........................................... H01L 21/306
[52] U.S. Cl. ...................................... 156/628; 29/580; 148/187; 156/643; 156/653; 156/657; 156/661; 156/662; 427/85; 427/93
[58] Field of Search ................... 148/187, 190; 29/571, 29/580; 357/24; 156/3, 11, 13, 17, 628, 643, 650–657, 662; 96/38.4; 427/85, 86, 93, 95

[56] References Cited

U.S. PATENT DOCUMENTS 3,810,795  5/1974  Troutman .............................. 148/187
3,911,560  10/1975  Amelio et al. ...................... 29/580 X Primary Examiner—William A. Powell
Attorney, Agent, or Firm—Spensley, Horn & Lubitz

[57] ABSTRACT

A method for forming a narrow gap in a material in which a first masking layer and a second masking layer are disposed on a layer of material and are selectively removed to expose a portion of the surface of the material. A third masking layer is then disposed on the material. The first and third layers and the material are then selectively etched to form such narrow gap. The portions of the material separated by the gap may be used as MOS integrated circuit gates and a gate may also be formed in the gap by first depositing an insulating layer in the gap and then filling the gap with a conductive material.

14 Claims, 21 Drawing Figures

METHOD FOR FORMING A NARROW GAP

BACKGROUND OF THE INVENTION

1. Field of the Invention

The invention relates in general to the field of processing materials for subsequent use in semiconductor devices and in particular to a method of forming a narrow gap in such a material.

2. Prior Art

In the fabrication of semiconductor devices, it is often necessary to form narrow gaps in a layer of material. One particular example of this is in the area of charge coupled devices (CCD) in which a silicon substrate is utilized as the charge transfer medium and a series of polycrystalline silicon, often referred to as polysilicon, gates insulated from the substrate and from one another are used both as storage gates and transfer gates. When a four phase clock system is used, two of the gates are used as hold gates and shallow or deep potential wells are formed thereunder by the clock voltages to hold and to assist in the transfer of a "bucket" of charge. The other two gates are placed between the hold gates and act as transfer gates, or valves, to retain and then allow the "bucket" of charge to move from beneath one storage gate to the next upon the application of appropriate clock voltages. In a practical case, the storage gates are 12 microns in width and are separated by a 6 micron gap in which the transfer gates are deposited, each transfer gate overlapping the edge of an adjacent storage gate by 3 microns. The above values are approximately the smallest values obtainable by present high volume manufacturing photolithographic techniques in which there is a ±3 micron alignment limit on the placement of a photo resist mask by such techniques, with several masking steps being required to obtain the above gate structure. A single cell under present techniques using a four phase, four gate system, thus occupies a linear dimension of 36 microns and a typical sixteen thousand bit CCD memory would occupy an area of approximately 0.2 cm × 0.56 cm. While this dimension may seem small, there is an ever increasing demand to reduce device size and increase device density in order to reduce power requirements and cooling requirements and increase manufacturing yield. While smaller device sizes may be obtained by electron beam techniques, such techniques are quite slow and very costly, thus making them unsuitable for low cost, batch fabricated devices.

Accordingly, it is a general object of the present invention to provide an improved method for forming gaps in materials.

It is another object of the present invention to provide a method for forming very narrow gaps in semiconductor materials using standard masking techniques.

It is yet another object of the present invention to provide an improved method of forming a compact gate structure useful in CCD memories.

It is still another object of the present invention to provide a method of forming very narrow gaps for use with ion implantation techniques.

SUMMARY OF THE INVENTION

A method for forming a narrow gap in a material is disclosed in which a first masking layer and a second masking layer are disposed on a layer of material and are selectively removed to expose a portion of the surface of the material. A third masking layer is then disposed on the material. The first, second and third layers and the material are then selectively etched to form such narrow gap.

In a first embodiment of the invention, the first and third layers are selectively etched to expose a portion of the surface of the material and the narrow gap is etched in the material through the exposed portion of the surface. In a second embodiment of the invention, the material is doped prior to the third layer being disposed, the first and third layers are etched to expose at least the surface of the doped material under the first layer and a selective etchant is used to etch the gap in the doped material. Alternatively, both the first and second layers can be removed and the gap formed in the material either by doping through the exposed portion in the first embodiment and then using a selective etchant or by doping as in the second embodiment and then using a selective etchant.

A gate may be formed in the gap by first depositing an insulating layer in the gap and then filling the gap with a conductive material. The portions of the material separated by the gap may also be used as gates; in such cases such portions generally comprise conductive material.

The novel features which are believed to be characteristic of the invention, both as to its organization and its method of operation, together with further objects and advantages thereof, will be better understood from the following description in connection with the accompanying drawings in which a presently preferred embodiment of the invention is illustrated by way of example. It is to be expressly understood, however, that the drawings are for purposes of illustration and description only and are not intended as a definition of the limits of the invention.

DETAILED DESCRIPTION OF THE INVENTION

Figure 1A:
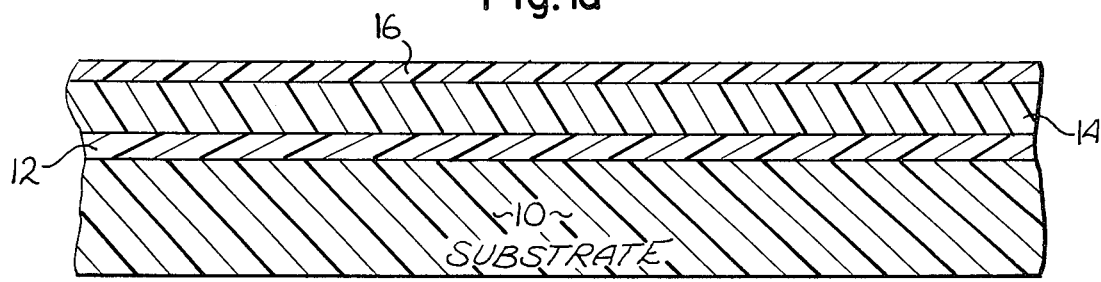
FIG. 1 illustrates the prior art method of forming a series of gates suitable for a CCD memory.
Figure 1B:
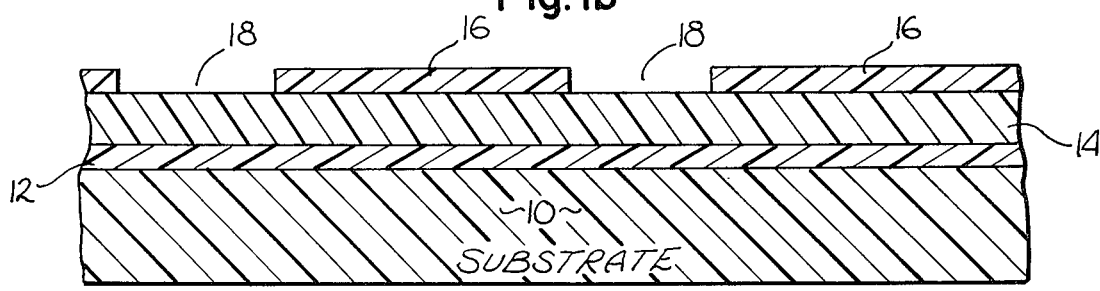
Figure 1C:
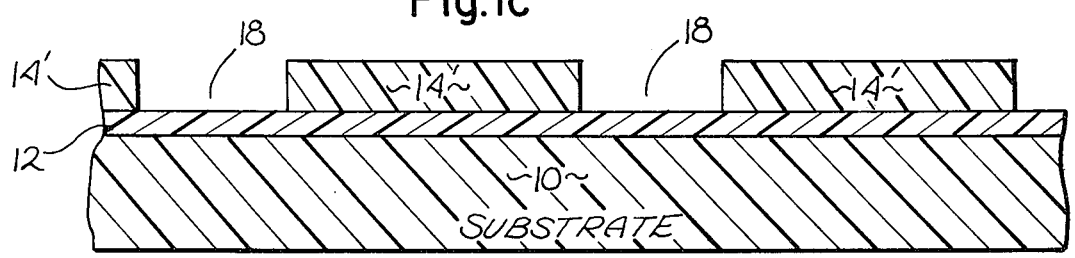
Figure 1D:
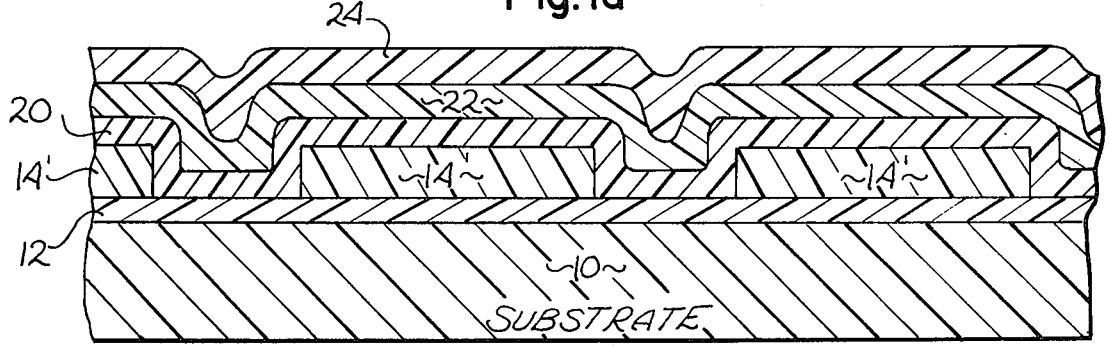
Figure 1E:
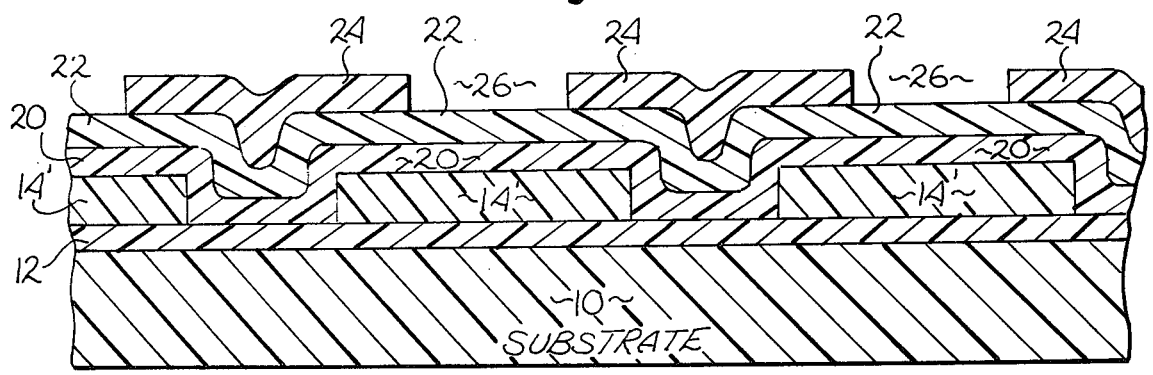

In FIG. 1, the prior art method of forming a series of gates suitable for a CCD memory is illustrated. In FIG. 1a, a silicon substrate 10 has disposed thereon a layer of oxide 12, a layer of polysilicon 14, and a layer of oxide 16. Using standard masking and etching techniques, a plurality of apertures 18 are formed in the oxide layer 16, as shown in FIG. 1b. These apertures 18 are approximately 6 microns wide and are approximately the smallest values obtainable by present high volume manufacturing photolithographic masking techniques. The polysilicon layer 14 is then etched using a polysilicon etch, and the oxide layer 16 is removed using an oxide etch, leaving a series of polysilicon gates 14' approximately 12 microns in width separated from one another by apertures 18, as shown in FIG. 1c. As shown in FIG. 1d, an oxide layer 20 is then disposed on the polysilicon layer 14 and in the apertures 18, a polysilicon layer 22 is disposed on top of the oxide layer 20 and an oxide layer 24 is disposed on top of the polysilicon layer 22. A plurality of apertures 26 are then etched in the oxide layer 24 utilizing a second mask. The resultant structure is shown in FIG. 1e. A polysilicon etch is then applied to the structure shown in FIG. 1e to etch a 6 micron aperture 28 in the polysilicon layer 22, as shown in FIG. 1f, thus forming a second series of polysilicon gates 22'. Finally, an oxide etch is applied to the structure shown in FIG. 1f to etch a 6 micron aperture 30 in the oxide layer 20 and to remove the remaining oxide layer 24. The structure as shown in FIG. 1g comprises a series of polysilicon gates 14', each 12 microns in width, separated by a 6 micron gap 18 in which has been disposed a layer of oxide 20' and a polysilicon gate 22' which overlaps the polysilicon gate 14' by 3 microns. Since two masking steps are required, since a tolerant alignment of ±3 microns must be allowed for each masking step and since the minimum aperture in a layer is approximately 6 microns, it is apparent that polysilicon gate 14' can be made no less than 12 microns in width, and that a four gate system would occupy a linear dimension of no less than 36 microns.

FIG. 2 illustrates a method of forming a series of narrow gaps using the present invention. As will be shown in connection with FIG. 4 hereafter, a series of extremely closely spaced gates can be formed utilizing the series of narrow gaps formed by the method shown in FIG. 2. Referring now to FIG. 2, a substrate 32 has thereon a masking layer 34, a layer of material 36, a masking layer 38, and a masking layer 40. In a particular embodiment, the substrate 32 would consist of silicon, the layer 34 would consist of an insulating layer of silicon oxide approximately 0.1 microns thick, the layer of material 36 would consist of a layer of polycrystalline silicon approximately 0.4 microns thick, commonly known as polysilicon, the layer 38 would consist of an insulating layer of silicon nitride approximately 0.1 microns thick, and the layer 40 would consist of an insulating layer of silicon oxide approximately 0.02 to 0.15 microns thick. While the following description refers to achieving narrow gaps in semiconductor materials, it is apparent that gaps could also be formed in oxide layers and metallic layers using the present invention. The oxide layer 40 is first masked and a series of apertures 42 are formed in the oxide layer 40 and the nitride layer 38, using, for example, an oxide etch and a nitride etch. Each of the apertures 42 would be 6 microns in width, as stated previously. A layer of insulation 44 is then disposed on the surface of the layer of semiconductor material 36 exposed by the apertures 42 to yield the structure shown in FIG. 2c. This may be a layer of thermal oxide formed by oxidizing the the structure shown in FIG. 2b to yield a layer approximately 0.25 microns thick. An extremely thin layer of insulation 44' is formed by such oxidation on the exposed edges of the insulating layer 38, which layer 44' would be approximately 0.002 microns thick. The layer 44' is removed from the surface of the layer 38 by a brief etch leaving, however, the layer 40 and the layer 44 substantially intact. The nitride layer 38 is then selectively etched, to expose portions 46 of the layer of semiconductor material 36. The width of the exposed portions 46 of the surface of the semiconductor material 36, as shown in FIG. 2d, can be extremely accurately controlled and are each typically made about 0.25 microns wide. The structure shown in FIG. 2d is then exposed to a preferential etch to create gaps 48 through the exposed portion of the surface 46 of the semiconductor material 36. The rate of etching of the gaps can be carefully controlled and gaps approximately 2 microns in width can be easily formed. As shown in FIG. 2e, a series of gaps 48 are formed in the semiconductor material 36 which are approximately 2 microns in width and which separate the semiconductor material 36 into a plurality of regions approximately 4 microns in width. The semiconductor material 36 can be previously doped so that a preferential etch, such as a doped polysilicon etch, can be used, which is approximately twice as slow as a typical polysilicon etch when used on undoped polysilicon. Alternatively, a doping can be performed through the exposed portion 46 of the semiconductor material 36 so as to dope a portion of the semiconductor material 36 in order that a doped polysilicon etch may be used.

Figure 2A:
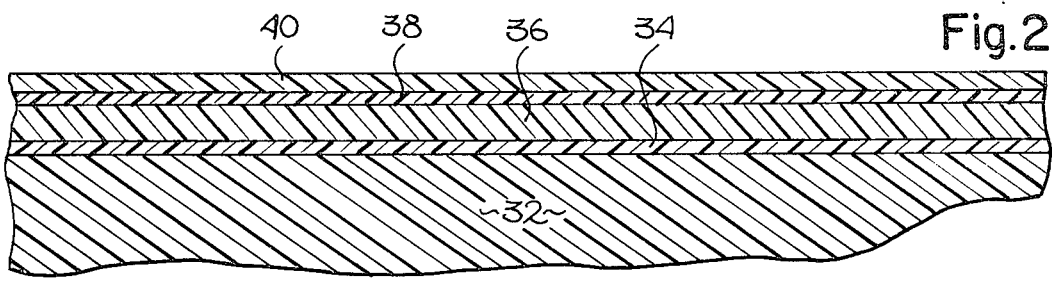
FIG. 2 illustrates a method for forming a series of narrow gaps using the present invention.
Figure 2B:
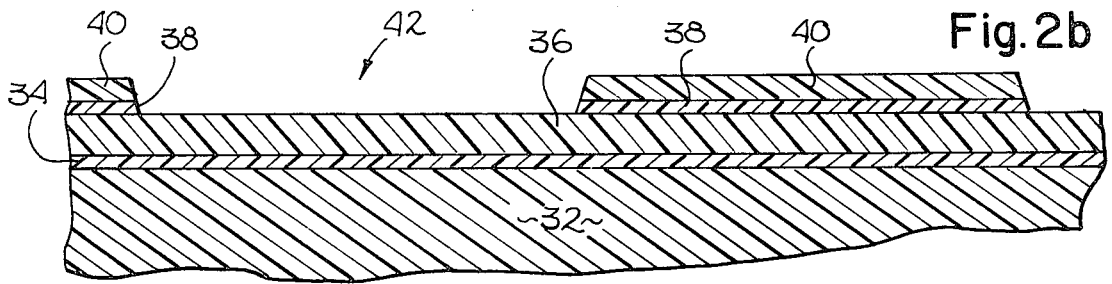
Figure 2C:
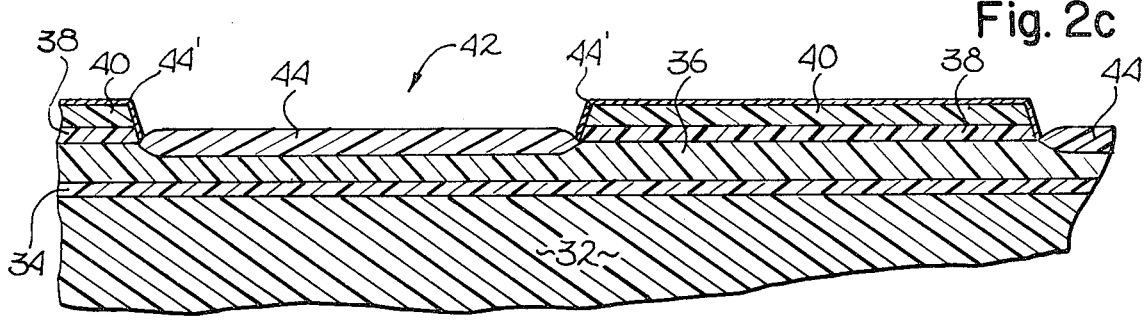
Figure 2D:
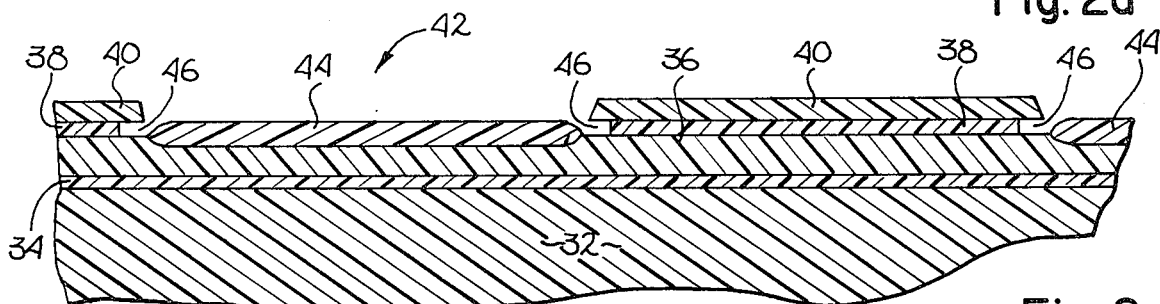

In FIG. 3 a second method of forming a series of narrow gaps using the present invention is illustrated. The starting structure shown in FIG. 3a is identical to that shown in FIG. 2a and the apertures 42 shown in FIG. 3b are formed in the same manner. At this point in the process, a doping is conducted so that the semiconductor material 36 becomes doped in the region of the apertures 42 to form regions of doped semiconductor material 36', including regions of doped semiconductor material 36" extending under the layer 38 as shown in FIG. 3b. A layer of oxide 44 is then disposed on the semiconductor material 36' to yield the structure shown in FIG. 2c, which structure is identical to that shown in FIG. 2b except for the doping of the semiconductor material 36' and 36". The layers 44' and the layer 38 can then be selectively etched as shown in FIG. 2d to expose the doped semiconductor region 36" or, as shown in FIG. 3d, may be completely removed along with the layer 40. Since the layer 44 is thicker than the layer 40, the layer 40 can be removed without completely removing the layer 44. A doping sensitive etchant is then applied to the structure shown in FIG. 3d to selectively etch the doped region 36" of the semiconductor material and part of the region 36' of the semiconductor material underlying the layer 44 to form a series of narrow gaps 48 as shown in FIG. 3e. The structure shown in FIG. 3e is substantially identical to the structure shown in FIG. 2e, except that the layer of semiconductor material 36 is now composed of a series of doped and undoped regions separated by the gaps 48. Since the undoped regions of the semiconductor material 36 are exposed, these regions can be subjected to a doping so that the layer of semionductor material 36 would become completely doped.

With respect to the method illustrated in FIG. 2, it should be noted that instead of etching into the exposed region 46 of the semiconductor material 36, a doping can be utilized as described before. The layers 38, 44 and 44' can then be removed and the semiconductor material 36 exposed to a doping sensitive etch which will remove the doped regions of the semiconductor material 36 while leaving the undoped regions of the semiconductor material 36 in tact, thus forming a series of gaps 48 in the semiconductor material 36.

Figure 2E:
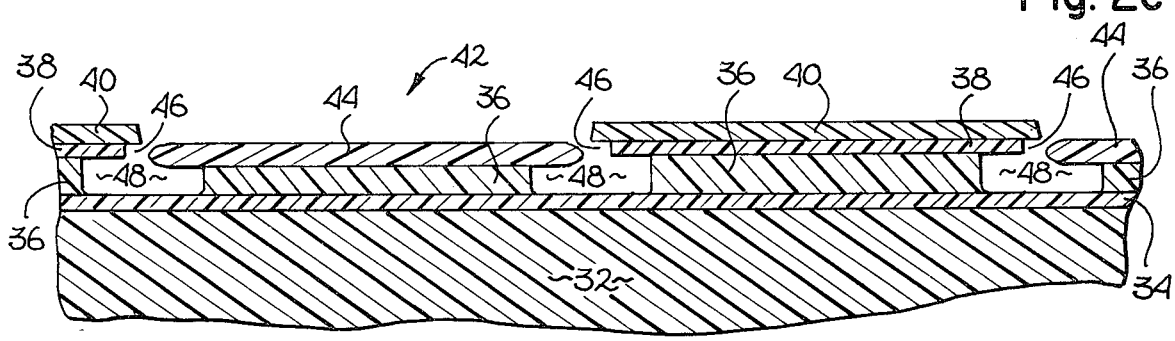
Figure 3A:
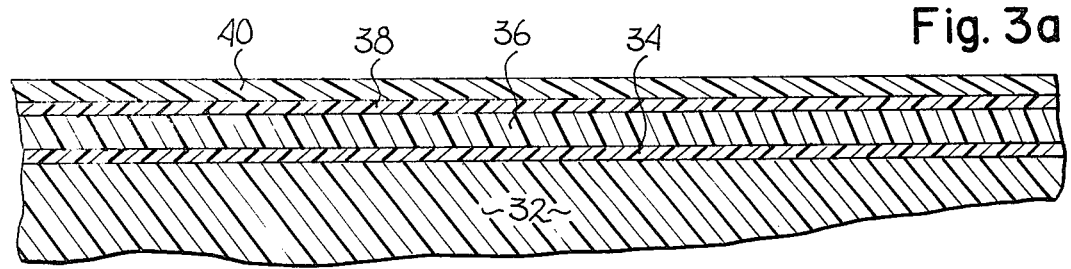
FIG. 3 illustrates a second method for forming a series of narrow gaps using the present invention.
Figure 3B:
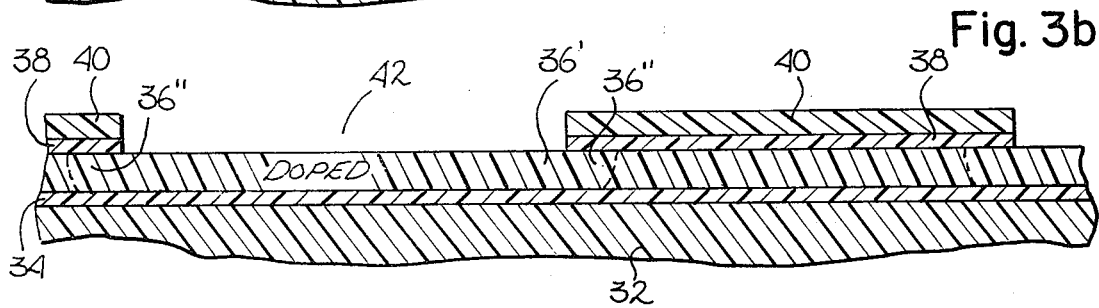
Figure 3C:
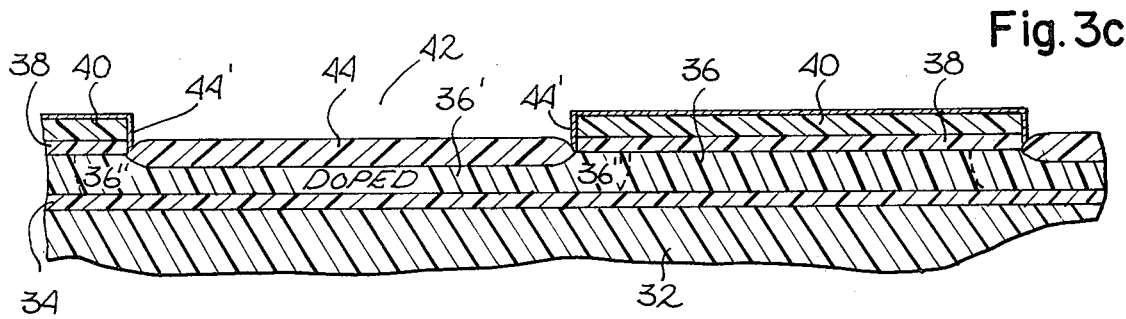
Figure 3D:
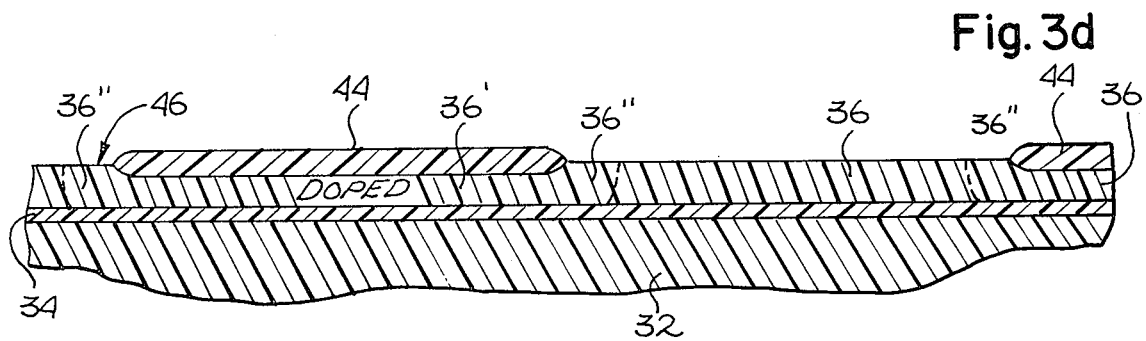
Figure 3E:
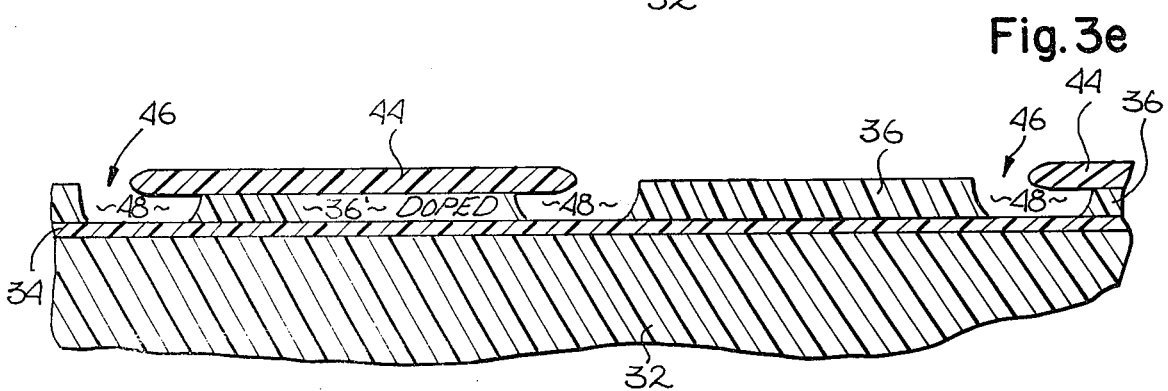

In FIG. 4 a method of forming a series of gates using the present invention is illustrated. In FIG. 4a the same structure as is shown in FIG. 2e is illustrated with the layer 40 being removed and the layer 44 being reduced to approximately 0.15 microns in thickness. The structure then has a layer of insulation disposed thereon, by for example vapor deposition or oxidation, to thicken the layer 34 and to place layers of insulation 50 on the walls of the gaps 48, as is shown in FIG. 4b. The layers 50 and the thickened layer 34' are approximately 0.2 microns thick. A thin layer of insulation 50' is also disposed on layer 38. The layer 44 is also thickened in the region of layer 36 to approximately 0.2 microns thick. The gaps 48 can then be filled with conductive material 52, such as polysilicon, using for example standard vapor deposition techniques to achieve the structure shown in FIG. 4c. It has been found preferable to make the exposed portions 46 approximately twice as wide as the depth of the gaps 48 so that the gaps 48 will be completely filled before the exposed portions 46 fill and close to the top of the gap 48. The upper portion of the conductive material 52 can then be etched away leaving a plurality of conductors 52 in the gaps 48, separating the plurality of segments of semiconductor material 36.

Figure 1F:
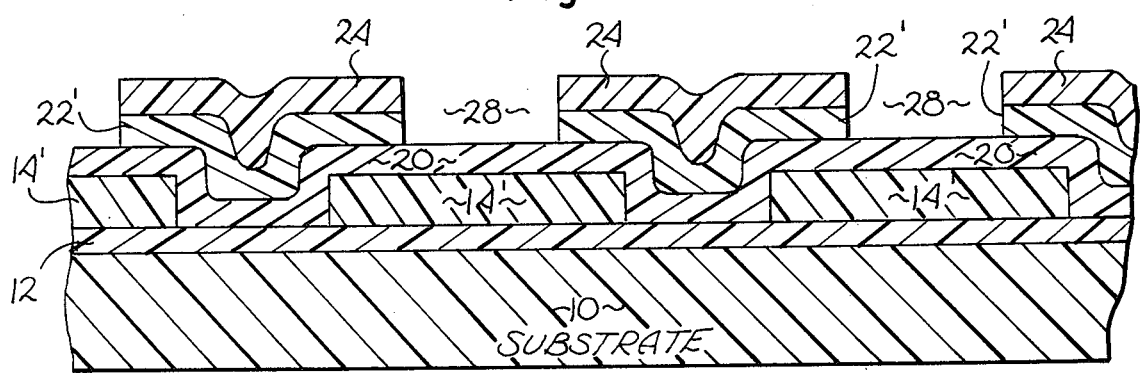
Figure 1G:
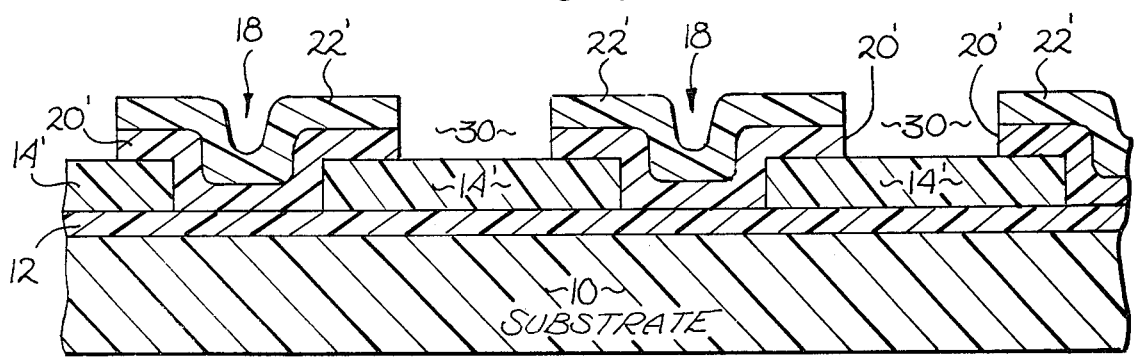
Figure 4A:
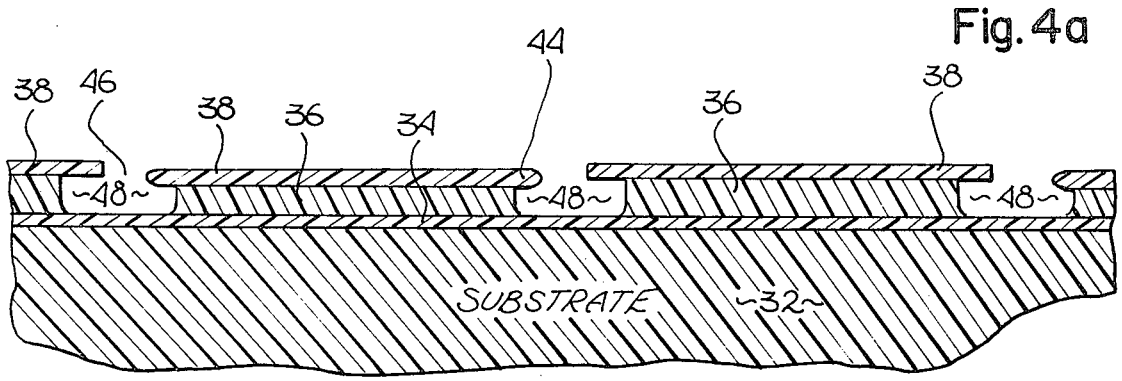
FIG. 4 illustrates a method of forming a series of gates using the present invention.
Figure 4B:
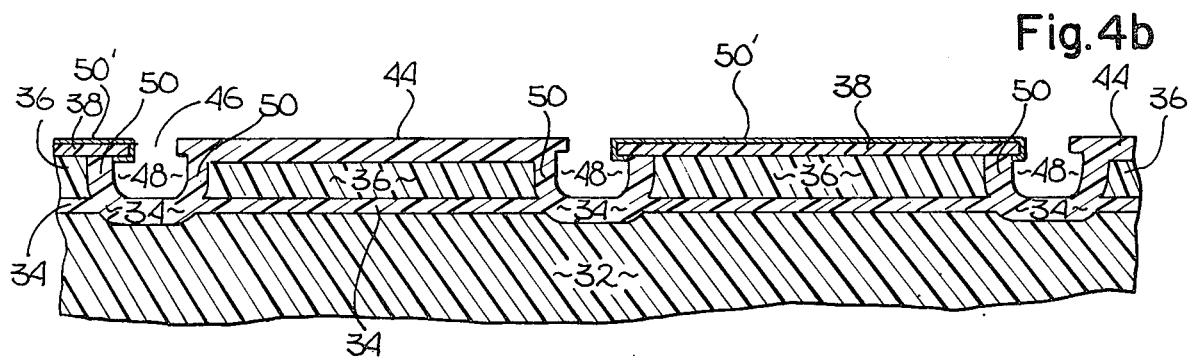
Figure 4C:
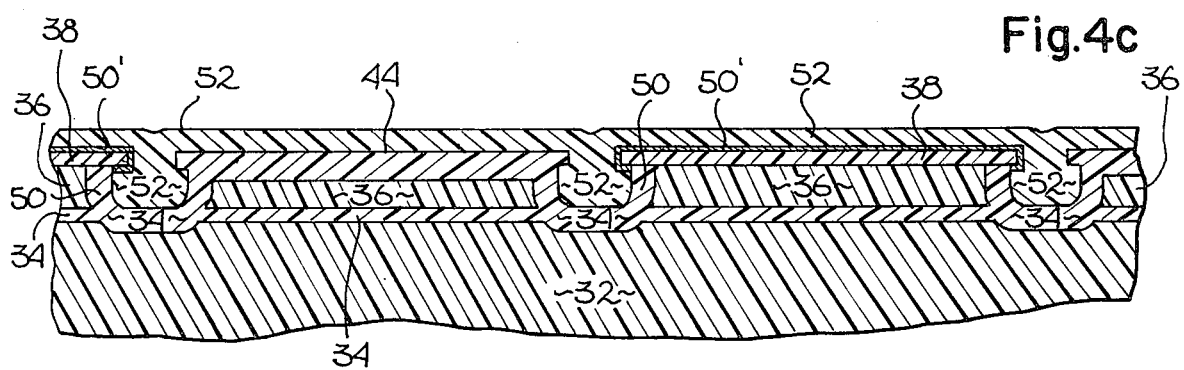
Figure 4D:
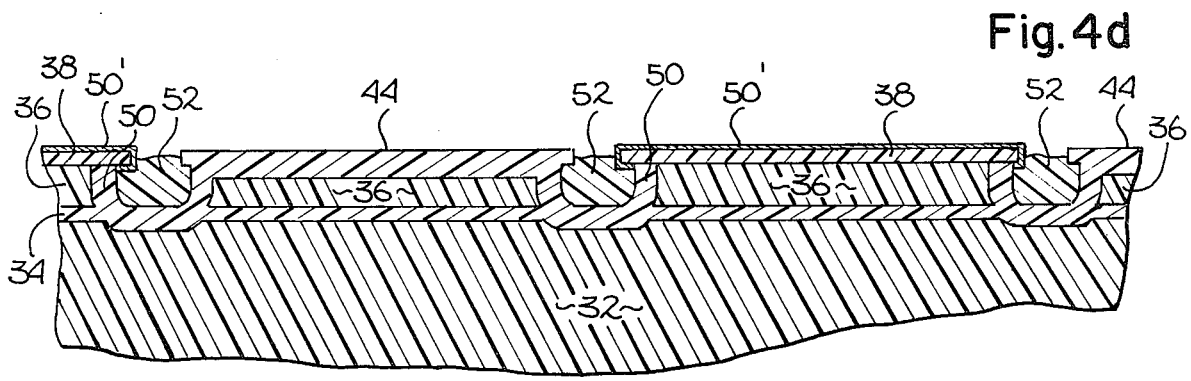

It should be noted that the structure shown in FIG. 4d is substantially identical to that shown in FIG. 1g except that the "gates" are now 4 microns in width instead of 12 microns in width and that the "gates" 52 are now 2 microns in width instead of 6 microns in width. Thus, a structure having a series of gates has been formed using only a single mask which occupies a linear dimension of 12 microns for a four phase, four gate system, approximately one third the linear dimension of the prior art technique and which occupies an area approximately one third that of prior art techniques. In addition, since only a single mask is needed, the two sets of gates are perfectly aligned and no gate overlap is needed (as shown in FIG. 1f), thus essentially eliminating the overlap capacitance existing on conventional gate arrays. Finally, it should be noted that the structure of FIG. 4a can be used to mask very narrow ion implants and thus allow the fabrication of other high density integrated circuit structures.

Having thus described the invention, it is obvious that numerous modifications and departures may be made by those skilled in the art; thus, the invention is to be construed as being limited only by the spirit and scope of the appended claims.

I claim:

1. A method for forming a narrow gap in a material comprising the steps in sequence, of:
   disposing a first masking layer on said material;
   disposing a second masking layer on said first masking layer;
   selectively removing said first and second masking layers to expose a first portion of the surface of said material;
   disposing a third masking layer on at least the exposed first portion of said material, a portion of said third masking layer being in immediate contact with said first masking layer;
   selectively removing after said third masking layer has been disposed said first and third masking layers to expose a second portion of the surface of said material underlying said remaining second masking layer; and
   selectively removing through said exposed second portion a preselected amount of said material to form said gap.

2. The method of claim 1 wherein the portion of said third masking layer in immediate contact with said first masking layer is selectively removed before selectively removing said first masking layer and said material.

3. The method of claim 1 wherein said second masking layer comprises a layer of silicon oxide, said first masking layer comprises a layer of silicon nitride, and said third masking layer comprises a layer of silicon oxide.

4. The method of claim 1 wherein said third masking layer is thermally grown.

5. The method of claim 1 wherein said material is a semiconductor material.

6. The method of claim 1 wherein said material is a layer of silicon disposed on an insulated substrate and said gap is etched through to said insulated substrate.

7. The method of claim 1 further comprising the step of performing an ion implantation through said gap into an underlying material.

8. The method of claim 1 comprising the further step of doping the exposed first portion of said material in which said gap is to be formed prior to disposing said third masking layer, said dopant diffusing under said first masking layer.

9. The method of claim 8 wherein a selective etchant is used for said material, said gap being etched in the doped portion of said material by said selective etchant through the exposed second portion thereof.

10. The method of claim 1 further comprising the steps of disposing an insulating layer on all the surfaces inside of said gap and filling said gap with a conductive material, whereby a series of gates may be formed.

11. The method of claim 10 wherein said material is polycrystalline silicon.

12. The method of claim 1 comprising the further step of doping the exposed second portion of said material in which said gap is to be formed subsequent to removing said first and third masking layers.

13. The method of claim 12 wherein a selective etchant is used for said material and at least a portion of said doped material is etched through said exposed second portion by said selective etchant to form said gap.

14. A method for forming a narrow gap in a material comprising the steps, in sequence, of:
   disposing a first masking layer on said material;
   disposing a second masking layer on said first masking layer;
   selectively removing said first and second masking layers to expose a first portion of the surface of said material;
   doping the exposed portion of said material, said dopant diffusing under said first masking layer;
   disposing a third masking layer on at least the exposed portion of said material;
   selectively removing said first, second and third masking layers after said third masking layer has been disposed to expose at least the doped portion of said material under said first masking layer; and
   removing at least a portion of said doped material to form said gap.

* * * * *